(12) United States Patent
Winarski

(10) Patent No.: US 9,410,246 B2
(45) Date of Patent: *Aug. 9, 2016

(54) GRAPHENE OPTIC FIBER LASER

(71) Applicant: Tyson York Winarski, Mountain View, CA (US)

(72) Inventor: Tyson York Winarski, Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/710,592

(22) Filed: May 13, 2015

(65) Prior Publication Data

US 2015/0255945 A1 Sep. 10, 2015

Related U.S. Application Data

(63) Continuation-in-part of application No. 14/070,574, filed on Nov. 3, 2013, and a continuation-in-part of application No. 14/673,872, filed on Mar. 31, 2015, now Pat. No. 9,328,018.

(51) Int. Cl.

| | |
|---|---|
| *G02B 6/02* | (2006.01) |
| *C23C 16/44* | (2006.01) |
| *H01S 3/067* | (2006.01) |
| *C23C 16/26* | (2006.01) |
| *H01S 3/094* | (2006.01) |
| *H01S 3/16* | (2006.01) |

(52) U.S. Cl.
CPC ............... *C23C 16/44* (2013.01); *C23C 16/26* (2013.01); *G02B 6/02395* (2013.01); *H01S 3/06716* (2013.01); *H01S 3/06733* (2013.01); *G02B 6/02042* (2013.01); *H01S 3/094007* (2013.01); *H01S 3/1608* (2013.01)

(58) Field of Classification Search
CPC ............................... H01S 3/067; G02B 6/0229
See application file for complete search history.

(56) References Cited

U.S. PATENT DOCUMENTS

| | | | | |
|---|---|---|---|---|
| 2007/0030558 | A1* | 2/2007 | Martinelli | ........ H04B 10/25133 359/334 |
| 2011/0222562 | A1* | 9/2011 | Jiang | ....................... H01S 3/067 372/6 |
| 2011/0285999 | A1* | 11/2011 | Kim | ..................... G01N 21/552 356/445 |
| 2012/0039344 | A1* | 2/2012 | Kian | ....................... H01S 3/067 372/6 |
| 2014/0341238 | A1* | 11/2014 | Kitabayashi | .......... H01S 3/0675 372/6 |

OTHER PUBLICATIONS

Ariel Ismach, Clara Druzgalski, Samuel Penwell, Adam Schwartzberg, Maxwell Zheng, Ali Javey, Jeffrey Bokor, and Yuegang Zhang, Direct Chemical Vapor Deposition of Graphene on Dielectric Surfaces, Nano Lett. 2010, 10, 1542-1548, American Chemical Society, Apr. 2, 2010.

Rui Wang, Yufeng Hao, Ziqian Wang, Hao Gong, and John T. L. Thong in Large-Diameter Graphene Nanotubes Synthesized Using Ni Nanowire Templates, Nano Lett. 2010, 10, 4844-4850, American Chemical Society, Oct. 28, 2010.

Jan Wasylak, Maria Lacka, Jan Kucharski. Glass of high refractive index for optics and optical fiber. Opt. Eng. 36(6) 1648-1651 (Jun. 1997) Society of Photo-Optical Instrumentation Engineers.

(Continued)

*Primary Examiner* — Sung Pak
*Assistant Examiner* — Hoang Tran
(74) *Attorney, Agent, or Firm* — The Winarski Firm, PLLC

(57) ABSTRACT

A graphene coated optic-fiber laser is disclosed that includes a doped inner core and an undoped outer core surrounding the doped inner core. A graphene cylinder or capsule surrounds the undoped outer core, thereby forming a cladding layer around the undoped outer core.

19 Claims, 13 Drawing Sheets

(56) References Cited

OTHER PUBLICATIONS

Jie Sun, Niclas Lindvall, Matthew T. Cole, Teng Wang, Tim J. Booth, Peter Bøggild, Kenneth B. K. Teo, Johan Liu, and August Yurgens. Controllable chemical vapor deposition of large area uniform nanocrystalline graphene directly on silicon dioxide. Journal of Applied Physics 111, 044103 (2012).

Zhancheng Li, Ping Wu, Chenxi Wang, Xiaodong Fan, Wenhua Zhang, Xiaofang Zhai, Changgan Zeng, Zhenyu Li, Jinlong Yang, and Jianguo Hou. Low-Temperature Growth of Graphene by Chemical Vapor Deposition Using Solid and Liquid Carbon Sources. ACSNANO vol. 5, No. 4, 3385-3390, 2011.

Takatoshi Yamada, Masatou Ishihara, and Masataka Hasegawa. Low Temperature Graphene Synthesis from Poly (methyl methacrylate) Using Microwave Plasma Treatment. Applied Physics Express 6 (2013) 115102-1.

Alex Gray, Mehdi Balooch, Stephane Allegret, Stefan De Gendt, and Wei-E Wang. Optical detection and characterization of graphene by broadband spectrophotometry. Journal of Applied Physics 104, 053109 (2008).

Efrain Mejia-Beltrán (2012). Rare-Earth Doped Optical Fibers, Selected Topics on Optical Fiber Technology, Dr Moh. Yasin (Ed.), ISBN: 978-953-51-0091-1.

\* cited by examiner

FIBER INDEX OF
REFRACTION PROFILE

GRAPHENE OPTIC FIBER LASER

This application claims the benefit of U.S. patent application Ser. No. 14/070,574 filed on Nov. 3, 2013, which is also hereby incorporated by reference. This application also claims the benefit of U.S. patent application Ser. No. 14/673,872 filed on Mar. 31, 2015, which is also hereby incorporated by reference.

BACKGROUND

An optic fiber laser is a laser in which the active gain medium is an optical fiber. Laser light is emitted by a dopant in the central core of the fiber. Commonly, the optic fiber core is doped with rare-earth elements such as erbium, ytterbium, neodymium, dysprosium, praseodymium, or thulium. A key factor for fiber lasers is that the fiber has a large surface-to-volume ratio so that heat can be dissipated relatively easily.

Fiber lasers are optically pumped, most commonly with laser diodes but in a few cases with other fiber lasers. The optics used in these systems are usually fiber components, with most or all of the components fiber-coupled to one another. In some cases, bulk optics are used, and sometimes an internal fiber-coupling system is combined with external bulk optics.

A diode pump source can be a single diode, an array, or many separate pump diodes, each with a fiber going into a coupler. The doped fiber has a cavity mirror on each end. These cavity mirrors are fiber Bragg gratings, which can be fabricated within the fiber. Typically, are no bulk optics on the end, unless the output beam goes into something other than a fiber. The fiber can be coiled, so the laser cavity can be many meters long if desired.

Using a fiber as a laser medium gives a long interaction length, which works well for diode-pumping. This geometry results in high photon conversion efficiency, as well as a rugged and compact design. When fiber components are spliced together, there are no discrete optics to adjust or to get out of alignment.

The fiber-based laser design is highly adaptable. It can be adapted to do anything from welding heavy sheets of metal to producing femtosecond pulses. Many variations exist on the fiber-laser theme, as well as some configurations that are not, strictly speaking, fiber lasers. Fiber amplifiers provide single-pass amplification. These amplifiers are used in telecommunications because they can amplify many wavelengths simultaneously. Fiber amplification is also used in the master-oscillator power-amplifier (MOPA) configuration, where the intent is to generate a higher output from a fiber laser. In some circumstances, an amplifier is used even with a continuous-wave (CW) laser.

Another example is fiber-amplified spontaneous-emission sources, in which the stimulated emission is suppressed. Yet another example is the Raman fiber laser using fluoride glass fibers, which relies on Raman gain that essentially Raman-shifts the wavelength.

However, the fiber host is usually silica glass with a rare earth dopant in the core. The primary dopants are ytterbium and erbium. Ytterbium has center wavelengths ranging from about 1030 to 1080 nm and can emit in a broader range of wavelengths if pushed. Using pump diodes emitting in the 940 nm range can make the photon deficit very small. Ytterbium has none of the self-quenching effects that occur in neodymium at high densities, which is why neodymium is used in bulk lasers and ytterbium is used in fiber lasers (they both provide roughly the same wavelength).

Erbium fiber lasers emit at 1530-1620 nm. This can be frequency-doubled to generate light at 780 nm, a wavelength that's not available from fiber lasers in other ways. Additionally, ytterbium can be added to erbium so that the ytterbium absorbs pump light and transfers that energy to erbium. Thulium is another dopant that emits even deeper into the near-infrared (NIR) 1750-2100 nm.

The use of optic fiber lasers have numerous advantages. The fact that the light is already in a flexible fiber allows it to be easily delivered to a movable focusing element. This feature is important for laser cutting, welding, and folding of metals and polymers. Fiber lasers can have active regions several kilometers long, and as such can provide very high optical gain. They can support kilowatt levels of continuous output power because of the fiber's high surface area to volume ratio, which allows efficient cooling. The fiber's waveguiding properties reduce or eliminate thermal distortion of the optical path, typically producing a diffraction-limited, high-quality optical beam. Fiber lasers are compact compared to rod or gas lasers of comparable power, because the fiber can be bent and coiled to save space. Fiber lasers exhibit high vibrational stability, extended lifetime, and low maintenance operation. High peak power and nanosecond pulses enable effective marking and engraving. The additional power and better beam quality provide cleaner cut edges and faster cutting speeds.

SUMMARY

A graphene coated optic-fiber laser is disclosed that includes a doped inner core and an undoped outer core surrounding the doped inner core. A graphene cylinder surrounds the undoped outer core, thereby forming a cladding layer around the undoped outer core. The graphene cylinder may be formed of a monolayer of graphene, bi-layer graphene, or multilayer graphene. The graphene cylinder is deposited onto the undoped outer core through a Chemical Vapor Deposition (CVD) process. The inner core is doped with a rare earth element. For example, the inner core is doped with an element such as erbium, ytterbium, neodymium, dysprosium, praseodymium, or thulium.

A graphene coated optic-fiber laser is disclosed that includes a doped inner core and an undoped outer core surrounding the doped inner core. A graphene capsule surrounds the undoped outer core, thereby forming a cladding layer around the undoped outer core. The graphene capsule is formed of a monolayer of graphene, a bi-layer graphene, or multilayer graphene. The graphene capsule is deposited onto the undoped outer core through a Chemical Vapor Deposition (CVD) process. The inner core is doped with a rare earth element. For example, the inner core is doped with an element such as erbium, ytterbium, neodymium, dysprosium, praseodymium, or thulium.

An optic-fiber laser assembly is disclosed that includes a first end-pump coupled to an optic fiber. The optic fiber is formed of a doped inner core and an undoped outer core surrounding the doped inner core. A graphene capsule surrounds the undoped outer core, thereby forming a cladding layer around the undoped outer core. The optic-fiber laser assembly may further include a second end-pump and an optic coupler. The optic coupler connects the first and second end-pumps to the optic fiber. The assembly may also include a side-pump connected to the optic fiber. The optic coupler is covered with graphene. The inner core is doped with an element selected such as erbium, ytterbium, neodymium, dysprosium, praseodymium, or thulium. The first end-pump, second end-pump and side pumps may be formed of a laser, a light emitting diode, or an organic light emitting diode.

Further aspects of the invention will become apparent as the following description proceeds and the features of novelty which characterize this invention are pointed out with particularity in the claims annexed to and forming a part of this specification.

BRIEF DESCRIPTION OF THE DRAWINGS

The novel features that are considered characteristic of the invention are set forth with particularity in the appended claims. The invention itself, however, both as to its structure and operation together with the additional objects and advantages thereof are best understood through the following description of the preferred embodiment of the present invention when read in conjunction with the accompanying drawings, wherein:

DETAILED DESCRIPTION

While the invention has been shown and described with reference to a particular embodiment thereof, it will be understood to those skilled in the art, that various changes in form and details may be made therein without departing from the spirit and scope of the invention.

Figure 1:
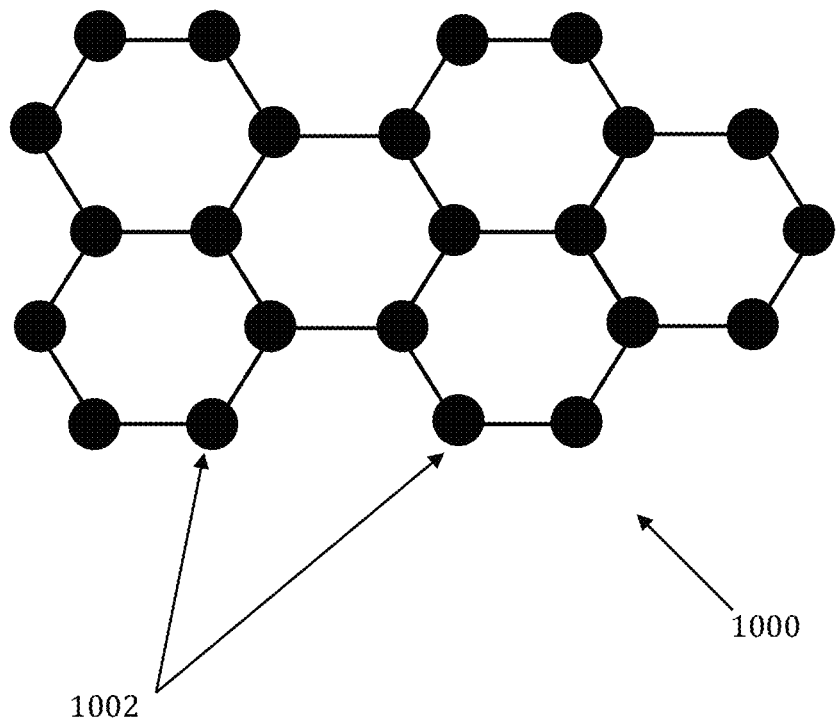
FIG. 1 illustrates a diagram of carbon atoms in a hexagonal lattice forming an atomically contiguous sheet of graphene.

FIG. 1 illustrates a diagram of carbon atoms 1002 in a hexagonal lattice forming an atomically contiguous sheet of graphene 1000. Graphene sheet 1000, also referred to as a graphene lattice 1000, is a flat monolayer of carbon atoms 1002 that are tightly packed into a two-dimensional lattice, thereby forming a sheet of graphene. Graphene lattice 1000 is 97.7% optically transparent. Thus, light used in combination with fiber optic cables can pass through a graphene layer for purposes of data transmission within a fiber optic communications network. Graphene lattice 1000 is an extremely strong material due to the covalent carbon-carbon bonds. It is desirable to utilize graphene lattices 1000 that are defect free as the presence of defects reduces the strength of graphene lattice 1000. The intrinsic strength of a defect free sheet of graphene 100 is 42 $Nm^{-1}$, making it one of the strongest materials known. The strength of graphene is comparable to the hardness of diamonds. Graphene is also a highly flexible material. Multiple monolayers of graphene sheet 1000 can be grown on top of each other to create a multi-layer graphene sheet. As discussed in FIG. 13, graphene exhibits a wavelength dependent index of refraction. It is therefore possible for graphene to function as a cladding layer in optic fiber applications when paired with an appropriate fiber optic core that has an index of refraction higher than that of graphene.

Figure 2:
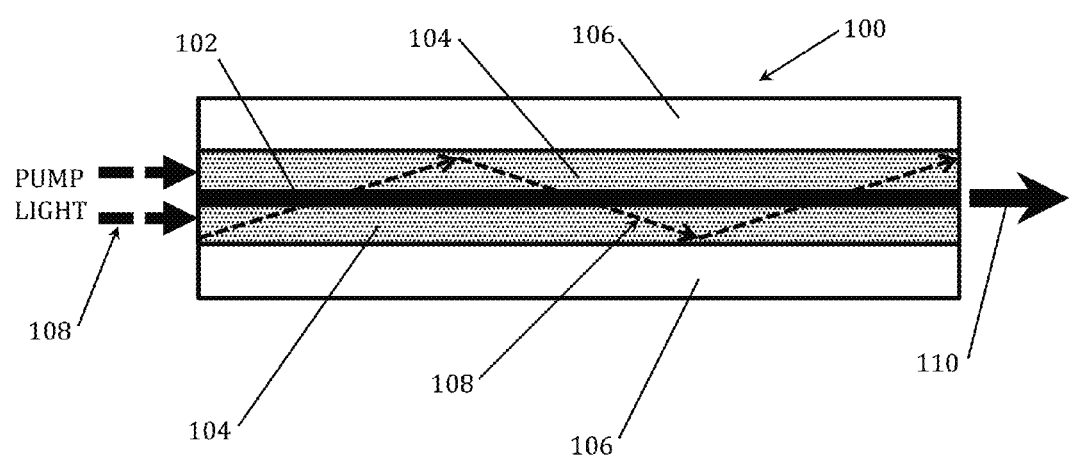
FIG. 2 illustrates a side view of an optic fiber for an optic fiber laser having graphene cladding.

FIG. 2 illustrates a side view of an optic fiber 100 for an optic fiber laser having graphene cladding 106. The optic fiber 100 has a doped inner core 102 and an undoped outer core 104. Doped inner core 102 is commonly made of silica. Undoped outer core 104 is also commonly made of silica. Optic fiber 100 has a dual core structure 102/104. Doped inner core 102 is the laser itself. Undoped outer core 104, also called an inner cladding, is the medium through which pump light 108 is channeled. Cladding 106, also referred to as outer cladding, is formed of graphene. Undoped outer core collects the pump light 108 and guides it along fiber 100. Inner core 102 becomes active by doping it with one or more atomic elements, usually (but not restricted to) rare-earths (RE's), more specifically, the lanthanides that occupy the atomic numbers 57 to 71 of the periodic table. For example, inner core 102 has a dopant such as erbium, ytterbium, neodymium, dysprosium, praseodymium, or thulium. Rare earths use three electrons in bonding to materials such as crystals and glasses to become triply ionized ions. Because they present absorption and emission bands from ultraviolet (UV) to near-infrared (NIR), the materials doped with these become very active in converting the properties of optical signals. Rare earth element doping of optical fibers is discussed more fully in the following technical paper hereby incorporated by reference: Efraín Mejía-Beltrán (2012). Rare-Earth Doped Optical Fibers, Selected Topics on Optical Fiber Technology, Dr Moh. Yasin (Ed.), ISBN: 978-953-51-0091-1. The dopant in doped inner core 102 is stimulated to emit radiation 110 by pump light 108. Graphene cladding 106 may be a monolayer of graphene, a bilayer of graphene, or multilayer graphene. Graphene features optic wave properties supporting the functioning of optic fiber 100 as an optic fiber laser. Further, graphene cladding 106 exhibits high thermal conductivity supporting heat dissipation from fiber 100 when it is lasing. Optical fiber inner core 102 and outer core 104 are commonly made of crystal quartz ($SiO_2$) that is melted and cooled down such that stays "frozen" in its vitreous state. This disordered pattern of the constituents, Silicon and Oxygen, produce randomly distorted unit cells of the crystal (quartz) to become silica. Other materials may be used for inner core 102 and outer core 104 such as zirconium-fluoride glasses, which are heavy metal fluoride glasses. One group of zirconium-fluoride glasses are ZBLAN glasses, which have a composition of $ZrF_4$—$BaF_2$—$LaF_3$—$AlF_3$—NaF. ZBLAN glass is a stable fluoride glass that may used to make optical fiber.

Fiber lasers are quasi-three-level systems. A pump photon excites a transition from a ground state to an upper level; the laser transition is a drop from the lowest part of the upper level down into some of the split ground states. Ultraviolet (UV) fiber lasers may, for example, be formed of an inner core 102 made of ZBLAN glass that is doped with thulium (Tm) that emits light having a wavelength of 284 nm, which is in the UV spectrum. UV lasers may also be formed of an inner core 102 made of ZBLAN glass that is doped with neodymium (Nd) that emits light having wavelengths of 380 nm and 410 nm, which are also in the UV spectrum. Ytterbium has center wavelengths ranging from about 1030-1080 nm and can emit in a broader range of wavelengths if pushed. Erbium fiber lasers emit at 1530-1620 nm.

Figure 3:
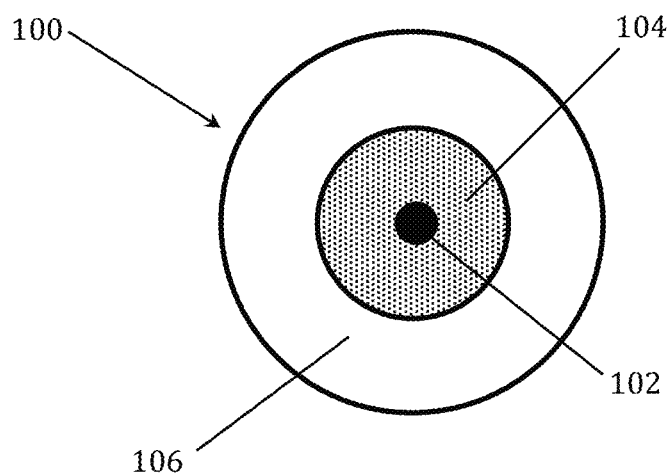
FIG. 3 illustrates an end view of an optic fiber for an optic fiber laser having graphene cladding.

FIG. 3 illustrates an end view of an optic fiber 100 of an optic fiber laser having graphene cladding 106. Note that doped inner core 100 is shown as being circular. Undoped outer core 104 is also shown as being circular. The illustration of undoped outer core 104 being circular is merely exemplary. There are a variety of non-circular geometric configurations for undoped outer core 104 including hexagonal, D-shaped and rectangular.

Figure 4:
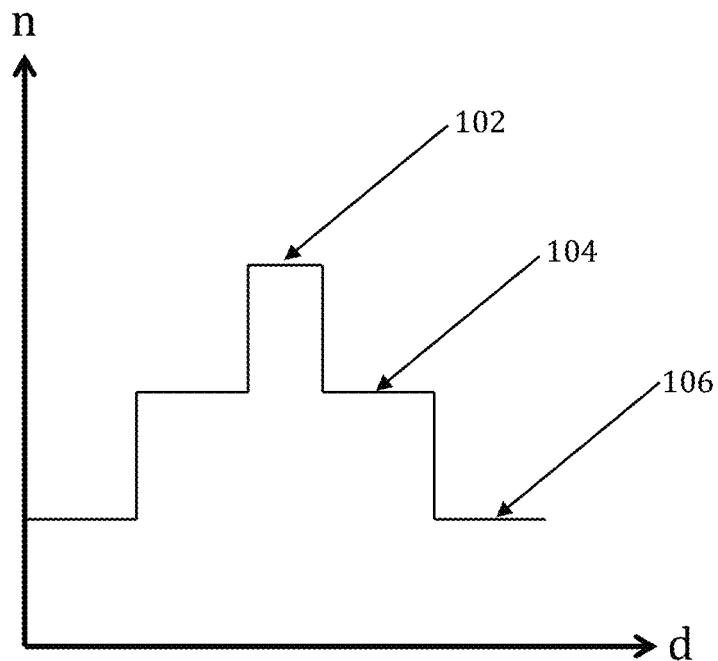
FIG. 4 illustrates an index of refraction profile for an optic fiber for an optic fiber laser having graphene cladding.
Figure 4:
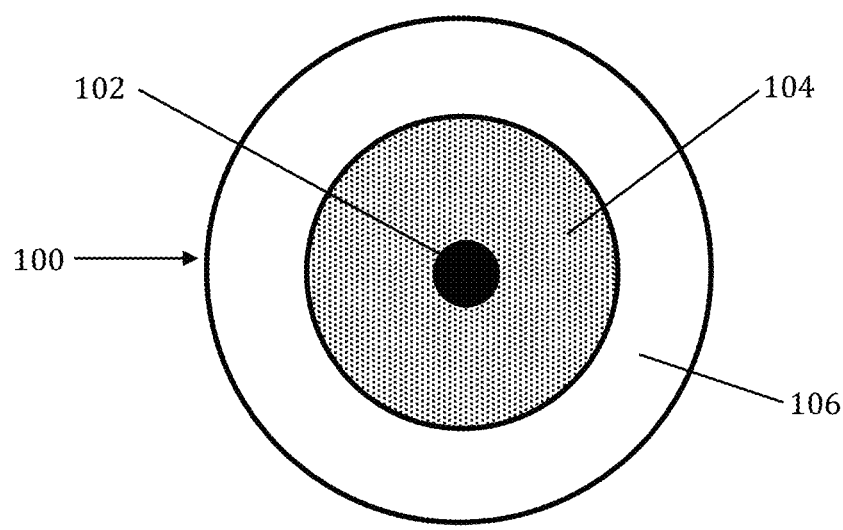

FIG. 4 illustrates an index of refraction profile for an optic fiber 100 of an optic fiber laser having graphene cladding 106. Optic fiber 100 includes inner core 102 and outer core 104 encased by graphene cladding 106. The index of refraction profile for fiber 100 is provided above fiber 100. Inner core 102 has the highest index of refraction. Outer core 104 has an index of refraction lower than inner core 102, but higher than cladding 106. Cladding 106 has an index of refraction lower than outer core 104. ZBLAN glass has a refractive index of 1.50. Silica typically has an index of refraction of 1.45. Graphene has a refractive index below 1.5 within the UV spectrum, making it a viable cladding material 106 for an inner core 102 and outer core 104 fiber 100 made of ZBLAN or silica when UV light below approximately 260 nm is used as the laser pump. Table 1 below provides a listing of pump lasers suitable for utilizing silica or ZBLAN for outer core 104 and/or inner core 102 and graphene for cladding 106. In this configuration, inner core 102 is preferably doped with neodymium (Nd).

TABLE 1

| Lasing Medium | Laser Type | Wavelength |
| --- | --- | --- |
| Argon SHG | Gas-Ion/BBO crystal | 257 nm |
| Argon SHG | Gas-Ion/BBO crystal | 250 nm |
| NeCu | Metal Vapor | 248-270 nm |
| Argon SHG | Gas-Ion/BBO crystal | 248 nm |
| KrF | Gas (excimer) | 248 nm |
| Argon SHG | Gas-Ion/BBO crystal | 244 nm |
| Argon SHG | Gas-Ion/BBO crystal | 238 nm |
| Ti: Sapphire (tripled) | Solid State | 235-330 nm |
| Argon SHG | Gas-Ion/BBO crystal | 229 nm |
| HeAg+ | Gas-Ion/BBO crystal | 224.3 nm |
| KrCl | Gas (excimer) | 222 nm |
| Nd:YAG | Solid State | 213 nm |
| ArF | Gas (excimer) | 193 nm |
| $F_2$ | Gas (excimer) | 157 nm |

Figure 5:
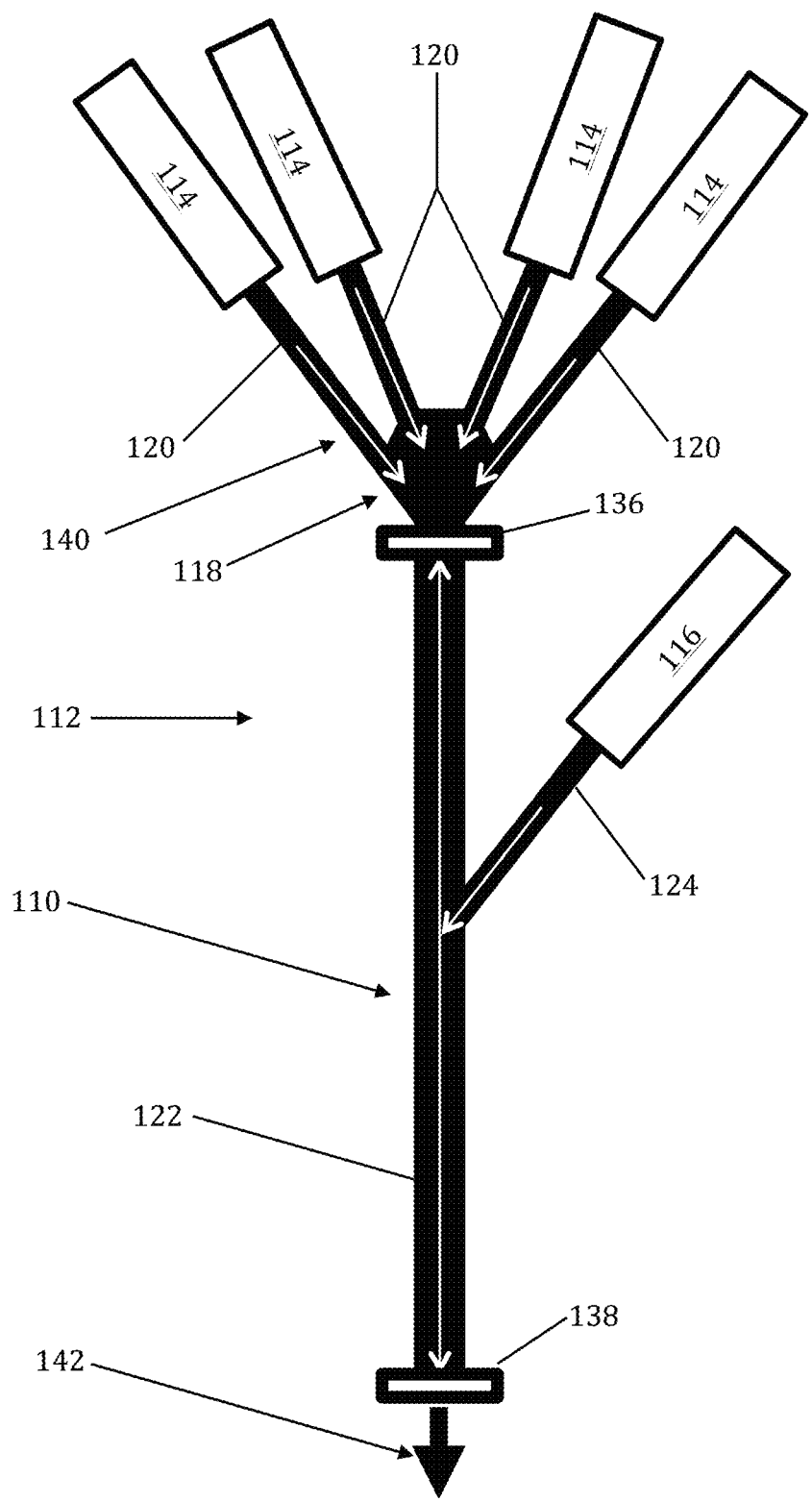
FIG. 5 illustrates an optic fiber laser assembly having a plurality of end laser pumps and a side laser pump coupled to an optic fiber having graphene cladding.

FIG. 5 illustrates an optic fiber laser assembly 112 having a plurality of end laser pumps 114 and a side laser pump 116 coupled to a primary optic fiber 122 having graphene cladding 106. In end-pumping, pump light 140 emanates from each laser down optic fibers 120. The white arrows 140 emanating from lasers 114 represent the laser pump light 140 coming from lasers 114. Lasers 114 are referred to as end-pump lasers as they feed pump light 140 into the end of the outer core 104 optic fiber 122. End-pump lasers 114 are coupled to optic fibers 120, which are feeder fibers that connect lasers 114 to primary optic fiber 122. Feeder fibers 120 are connected to primary optic fiber by optic coupler 118. Optic fiber laser assembly 112 may have any number of end-pump lasers 114. The illustration of four end-pump lasers 114 is merely exemplary. Optic fiber laser assembly 112 may also have a side-pump laser 116. The illustration of a single side-pump laser 116 is merely exemplary. Optic fiber laser assembly 112 may have any number of side-pump lasers. Lasers 114 and 116 inject pump light 110 into the outer core 104 of fiber 122. This pump light 110, shown by the bidirectional white arrow, excites the dopant present in inner core 102 of fiber 122. The excitation of the dopant present in inner core 102 causes inner core 102 to emit radiation. An optical cavity is created by mirrors 136 and 138 that are arranged such that laser signal light 110 amplifies as it travels back and forth through gain medium 102. Mirrors 136 and 138 can be dichroic filters, Bragg gratings or simply perpendicular cleaved facets of fiber-ends. Mirror 136 is a high reflector (HR) as it has high transmission for the wavelength of the pump light 140 and high reflection for the laser signal 110. Mirror 138 is an output coupler (OC) that partially reflects laser signal 110 and transmits part laser signal 110 that then forms laser beam 142. End pumps 114 and side pumps 116 may be formed of a laser, a light emitting diode, or an organic light emitting diode for example.

Figure 6:
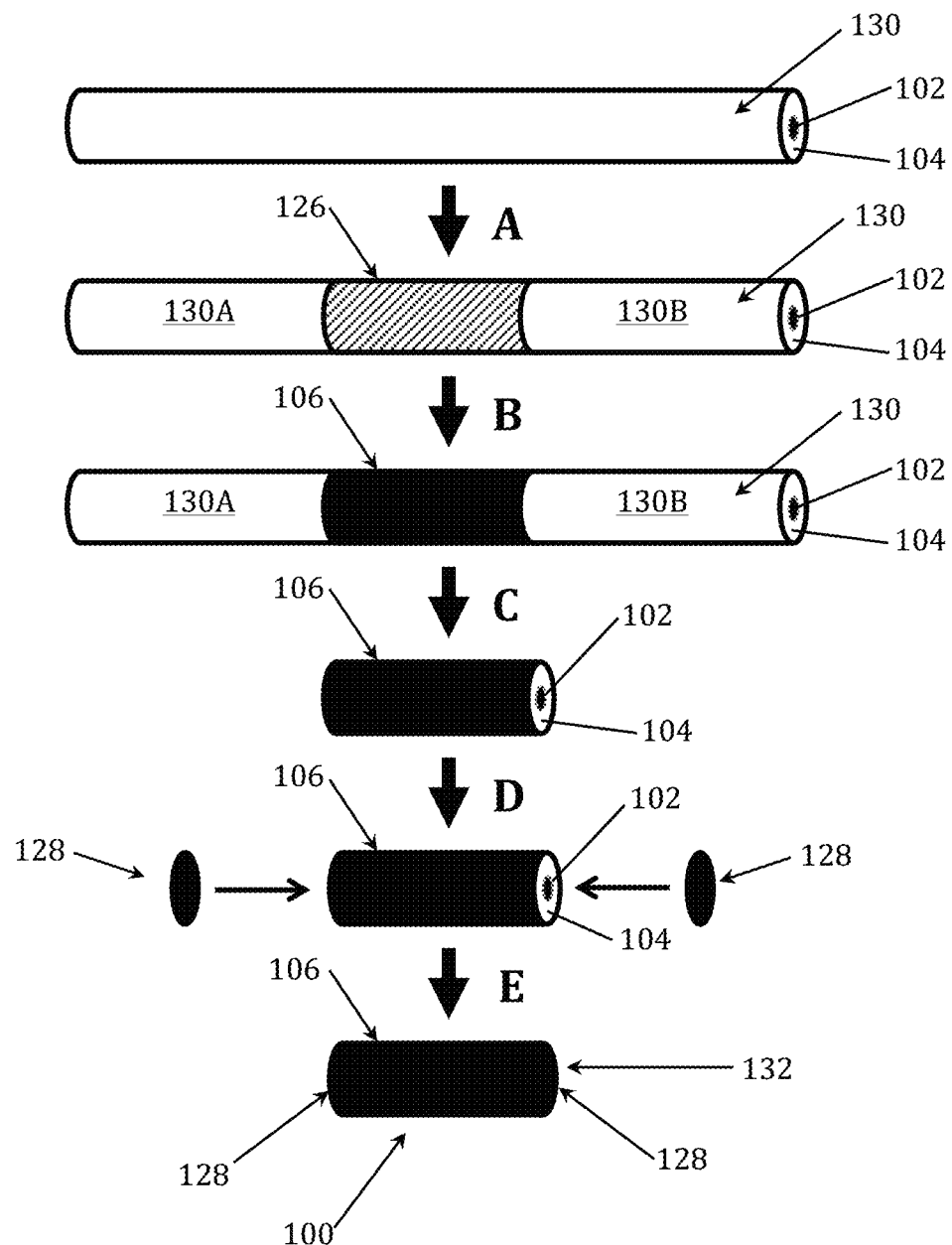
FIG. 6 illustrates a process schematic of fabricating an optic fiber for an optic fiber laser having an inner core, outer core and encapsulated by a graphene layer, which forms a cladding layer.

FIG. 6 illustrates a process schematic of fabricating an optic fiber 100 having an inner core 102 and outer core 104 encapsulated by a graphene layer 132, which forms a cladding layer 106. Initially, an optic fiber core 130 was prepared and cleaned with alcohol and acetone. Optic fiber inner core 102 may be formed of silica. Optic fiber outer core 104 may also be formed of silica. In this example, as both inner core 102 and outer core 104 are formed of silica, CVD processes may be used to deposit graphene on fiber core 130. The use of silica for inner core 102 and outer core 104 is exemplary. Other materials for optic fiber inner core 102 and outer core 104 may be used. Note that inner core 102 is preferably doped with a material, such as a rare earth element, that emits radiation when excited. For example, inner core 102 has a dopant such as erbium, ytterbium, neodymium, dysprosium, praseodymium, or thulium.

In process step A depicted in FIG. 6, a copper layer 126 is deposited around the middle of optic fiber core 130. Copper layer 126 may be deposited via a sputtering method. One exemplary thickness for copper layer 126 is 1.3 m. However, any length of copper layer 126 may be created. Copper layer 126 is a sacrificial layer deposited to support the deposition of graphene layer 106 on optic fiber core 130. Alternatively, sacrificial copper film 126 may be evaporated onto optic fiber core 130 through use of an electron-beam evaporation process. Note that optic fiber core regions 130A and 130B are not covered by copper film 126. Next in step B depicted in FIG. 6, optic fiber core 130 with copper layer 126 is placed within a Chemical Vapor Deposition (CVD) chamber. In one exemplary process, under a controlled temperature and pressure of 900° C. and 1 MPa and catalyzed by copper layer 126, a monolayer of graphene 106 was grown on copper layer 126 in 2 hours using $H_2$ and $CH_4$ at 50 sccm (standard cubic centimeters per minute). Multilayer graphene can be grown on optic fiber 130 through longer growth times. Subsequently, the temperature within the CVD chamber was increased to 1020° C. and the pressure was decreased to 100 kPa and held constant for a period of 10 hours during which the copper atoms evaporated off, thereby leaving a graphene cylinder 106 surrounding optic fiber core 130 without any intervening copper layer 126. Silica optic fiber core 130 is resilient to morphological changes at 900-1020° C. required for the CVD growth of high-quality graphene due to the high melting point of silica of 1600° C.

Next, in step C depicted in FIG. 6, bare optic fiber core ends 130A and 130B are cut off and removed from the portion of optic fiber core 130 covered with graphene cylinder 106. In step C depicted in FIG. 6, graphene cylinder 106 covers the length of optic fiber core 130. However, the ends of optic fiber core 130 remain uncovered with graphene. In this step, optic fiber core 130 and graphene cylinder 106 are cleaned with acetone, alcohol and deionized water. In step D depicted in FIG. 6, premade circular graphene films 128 are applied to the ends of optic fiber 130, thereby encapsulating optic fiber core 130 within a graphene capsule formed of graphene cylinder 106 and graphene ends 128. Subsequently in step E depicted in FIG. 6, optic fiber may optionally be exposed to a carbon atmosphere to create carbon-carbon bonds between graphene ends 128 and graphene cylinder 106. Cladding 106 is one or more layers of materials of lower refractive index, in intimate contact with a core material 102 and 104 of higher refractive index. The cladding 106 causes light to be confined to the core 102/104 of the fiber 100 by total internal reflection at the boundary between the two layers. Light propagation in the cladding 106 is suppressed in typical fiber. Some fibers can support cladding modes in which light propagates in the cladding 106 as well as the core 102/104. Due to its strength and flexibility, graphene cylinder 106 functions to provide mechanical support to optic fiber 100. Circular graphene sheets 128 protect the ends of optic fiber core 130 from mechanical damage. Graphene cylinder 106, due to its optic properties, may function as an optic waveguide in combination with core 130.

The above process for forming a graphene capsule around optic fiber core 130 is exemplary. Other processes may be used to form an optic fiber formed of a silica optic fiber inner core 102 and outer core 104 surrounded by a graphene capsule 106 as cladding. For example, CVD may be used to entirely grow a graphene capsule around silica optic fiber core 130. CVD of graphene onto a solid circular rod such as a nanowire or a silica optic fiber core 130 produces a graphene capsule 132 that completely encapsulates silica optic fiber core 130. This graphene capsule 132 is formed of a cylinder of graphene 106 surrounding optic fiber core 130 along its lengths with graphene surfaces 128 covering the two ends of the graphene cylinder 106. The process begins with evaporating a sacrificial copper film 126 onto the silica optic fiber core 130 as shown in FIG. 6 that also covers the ends of core 130. An electron-beam evaporation process is used to deposit the copper film 126 onto the silica optic fiber core 130. Next, silica optic fiber core 130 having sacrificial copper layer 126 is inserted into a CVD chamber. Silica optic fiber core 130 is heated to 1000° C. CVD of graphene is the performed on optic fiber core 130 with durations varying from 15 min up to 7 h at 1000° C. Given the fact that that the melting temperature of the copper is ~1084° C., along with the high temperature during the growth of ~4000° C., and the low pressure in the chamber, 100-500 mTorr, copper film 126 de-wets and evaporates during the CVD process. Ethylene ($C_2H_4$) or $CH_4$ is introduced into the CVD chamber as the carbon-containing precursor, in addition to the $H_2/Ar$ flow. The precursor feeding time, typically in the order of a few to tens of seconds, determines the number of layers of graphene grown. The sample may then be cooled to room temperature within 5 min in a flow of 133 sccm Ar at 20 Torr chamber pressure. Silica optic fiber core 130 is resilient to morphological changes at ~1000° C. required for the CVD growth of high-quality graphene due to the high melting point of silica of 1600° C. During this CVD process, sacrificial copper layer 126 de-wets and evaporates exposing silica optic fiber core 130 directly to graphene layer 106 and 128. In this process, graphene ends 128 are formed on optic fiber core 130 through CVD deposition.

A monolayer of graphene 132 may be formed on optic fiber core 130. Alternatively, multilayer graphene 132 may be formed on optic fiber core 130. The number of graphene sheets is determined by the growth time and is independent of tube diameter and tube length. As a consequence of this process, a silica optic fiber core 130 is encapsulated within a graphene capsule 132. Graphene capsule 132 provides mechanical strength to optic fiber core 130. It is contemplated that the above discussed CVD process of graphene deposition may occur on conventional silica optic fibers having diameters of 8-10 μm, 50 μm, 62.5 μm, and 100 μm. These diameter ranges are merely exemplary and are non-limiting. Another process of forming a graphene capsule 132 can be performed through wrapping optic fiber core 130 with a prefabricated sheet of graphene, thereby forming a graphene cylinder 106 around optic fiber core 130. Circular graphene ends 128 can then be adhered to the ends of optic fiber core 130, thereby encapsulating optic fiber core 130. Carbon-carbon bonds can be formed between graphene cylinder 106 and circular graphene ends 128 by exposure to a carbon atmosphere.

Processes for creating tubular graphene structures, also known as carbon nanotubes, have been demonstrated on 70 nm Nickel (Ni) nanowires as described in the following publication, hereby incorporated by reference: Rui Wang, Yufeng Hao, Ziqian Wang, Hao Gong, and John T. L. Thong in *Large-Diameter Graphene Nanotubes Synthesized Using Ni Nanowire Templates*, Nano Lett. 2010, 10, 4844-4850, American Chemical Society, Oct. 28, 2010. However, unlike the process disclosed by Wang utilizing a sacrificial Ni nanowire template, the present invention utilizes a silica optic fiber core 130 that is retained as an essential component of the optic fiber 100 contained within a cylindrical graphene sheet 106, i.e. a carbon nanotube, capped at both ends by sheets 128 to encapsulate optic fiber core 130 with graphene capsule 128. Processes for direct chemical vapor deposition of graphene on dielectric surfaces such as silica are described in the following publication, hereby incorporated by reference: Ariel Ismach, Clara Druzgalski, Samuel Penwell, Adam Schwartzberg, Maxwell Zheng, Ali Javey, Jeffrey Bokor, and Yuegang Zhang, *Direct Chemical Vapor Deposition of Graphene on Dielectric Surfaces*, Nano Lett. 2010, 10, 1542-1548, American Chemical Society, Apr. 2, 2010.

In another exemplary process, graphene capsule 132 may be deposited directly on to optic fiber core 130 without the use of a metal catalyst, such as sacrificial copper layer 126. The CVD is performed in an atmospheric pressure hot-wall quartz tube furnace. $CH_4$ is used as a carbon precursor gas, mixed with auxiliary reduction ($H_2$) and carrier (Ar) gases. The optic fiber core 100 is heated to 1000° C. (at a rate of 30° C./min) under $H_2$ (50 sccm) and Ar (1000 sccm) atmosphere and kept at 1000° C. for 3 min. Then, 300 sccm $CH_4$ is introduced to initiate the formation of graphene. The typical growth time is 30-60 min. After the deposition, the $CH_4$ flow is stopped, leaving other gases to flow for further 3 min to remove residual reaction gases before allowing the chamber to naturally cool to room temperature (20° C./min) in the same $H_2$—Ar atmosphere. The graphene layer 106 can also be deposited directly on $SiO_2$ by using other hydrocarbon precursors, such as $C_2H_2$, showing the generality of the process. The growth of graphene directly on a silica substrate is reported in the following publication, hereby incorporated by reference: Jie Sun, Niclas Lindvall, Matthew T. Cole, Teng Wang, Tim J. Booth, Peter Bøggild, Kenneth B. K. Teo, Johan Liu, and August Yurgens. *Controllable chemical vapor deposition of large area uniform nanocrystalline graphene directly on silicon dioxide*. Journal of Applied Physics 111, 044103 (2012).

While optic fiber core 130 may be formed of silica, other glasses with higher indicies of refraction may be used for optic fiber inner core 102 and outer core 104. For example, inner core 102 and outer core 104 may be made from chalcogenide glass. Chalcogenide glasses are based on the chalcogen elements S, Se, and Te. These glasses are formed by the addition of other elements such as Ge, As, Sb, and Ga. These glasses are low-phonon-energy materials and are generally transparent from the visible up to the infrared. Chalcogenide glasses can be doped by rare-earth elements such as Er, Nd and Pr. One class of chalcogenide glasses that may be used for inner core 102 and outer core 104 are halide-chalcogenide glasses. Halide-chalcogenide glasses have properties that make them suitable for optical fibers and they are reported to have indices of refraction n ranging from 2.54 to 2.87. The processes discussed above are not compatible with halide-chalcogenide glasses due to the high temperatures of the CVD process. Halide-chalcogenide glasses have a melting temperature of 378° C. and would not survive a CVD process at 900-1020° C. However, a variety of low-temperature graphene synthesis techniques are known with very low thermal budgets. With these techniques, the halide-chalcogenide glasses are heated to temperatures around 300° C. for graphene growth. For example, a halide-chalcogenide optic fiber core 130 may be heated in a CVD chamber to 300° C. and exposed to a benzene precursor as the carbon source to create a monolayer of graphene. This process is reported in the following publication, hereby incorporated by reference: Zhancheng Li, Ping Wu, Chenxi Wang, Xiaodong Fan, Wenhua Zhang, Xiaofang Zhai, Changgan Zeng, Zhenyu Li, Jinlong Yang, and Jianguo Hou. *Low-Temperature Growth of Graphene by Chemical Vapor Deposition Using Solid and Liquid Carbon Sources*. ACSNANO VOL. 5, NO. 4, 3385-3390, 2011. In an alternative low temperature process, graphene film may be synthesized on a halide-chalcogenide optic fiber core 130 at 280° C. utilizing a microwave plasma treatment in combination with PolyMethylMethacrylate (PMMA). With this process, a layer of PMMA is spin-coated onto a halide-chalcogenide optic fiber core 130 at room temperature. The PMMA coated halide-chalcogenide optic fiber core 130 is then inserted into a slot antenna-type microwave plasma CVD system for microwave plasma treatment at 280° C. The plasma treatment time is 30 seconds. This plasma treatment process is disclosed in the following publication, hereby incorporated by reference: Takatoshi Yamada, Masatou Ishihara, and Masataka Hasegawa. *Low Temperature Graphene Synthesis from Poly(methyl methacrylate) Using Microwave Plasma Treatment*. Applied Physics Express 6 (2013) 115102-1. Another low temperature method of coating optic fiber cores with graphene is to wrap optic fiber cores with premade graphene sheets. Atomic forces adhere the premade graphene sheets to the optic fiber. A long rectangular sheet of premade graphene would wrap the length of the optic fiber in a graphene tube. A pair of premade circular graphene end sheets would cover the ends of the optic fiber. The graphene sheets may be made for example by CVD deposition of graphene onto copper sheets. A preferred embodiment for laser assembly 112 is provided below in TABLE 2 utilizing chalcogenide glass.

TABLE 2

| Pump Laser 114/116 | Cladding Material 106 | Outer Core Material 104 | Inner Core Material 102 | Dopant for Inner Core 102 | Emitted Laser Frequency |
|---|---|---|---|---|---|
| Ti: Sapphire laser at 815 nm | Graphene | Chalcogenide Glass Fiber | Chalcogenide Glass Fiber | Neodymium (Nd) | Infra-red 1080 nm |
| Solid-State Laser at 1480 nm | Graphene | Chalcogenide Glass Fiber | Chalcogenide Glass Fiber | Erbium (Er) | Infra-red 980 nm |

Figure 7:
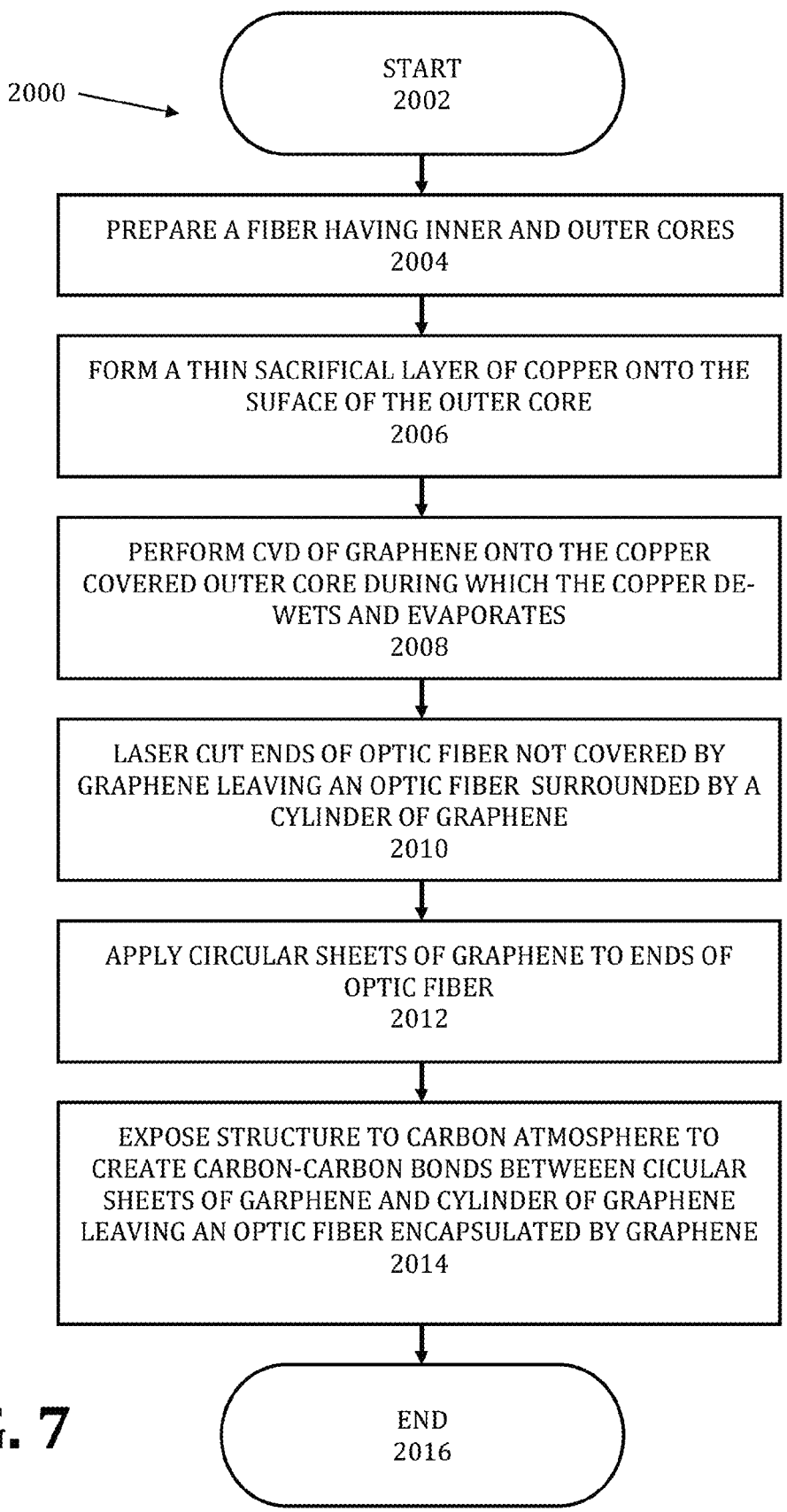
FIG. 7 illustrates a flow chart depicting a process of fabricating an optic fiber for an optic fiber laser having a core and cladding formed by graphene.

FIG. 7 illustrates a flow chart 2000 depicting an exemplary process of fabricating an optic fiber 100 having an inner core 102, outer core 104 and graphene cladding 106 that forms mechanical support and an optic waveguide around core 130. The process begins with START 2002. An optic fiber having a core and cladding made of silica is prepared and cleaned with acetone and alcohol in step 2004. In step 2006, a thin sacrificial layer of copper 126 is formed onto the surface of optic fiber core 130. Next in step 2008, a CVD process is performed depositing graphene layer 106 onto optic fiber core 130 during which the sacrificial copper layer 126 evaporates. Then in step 2010, the ends of optic fiber core 130 not covered by graphene cylinder 106 are cut for example, by a laser. In this step, optic fiber core 130 and graphene cylinder 106 are cleaned. In step 2012, circular sheets of graphene 128 are applied to the ends of optic fiber core 130, thereby forming a graphene capsule 132 encapsulating optic fiber core 130. In step 2014, exposing graphene sheets 128 and graphene cylinder 106 to a carbon atmosphere creates carbon-carbon bonds between graphene cylinder 106 and graphene sheets 128, thereby further creating a graphene capsule 132 encapsulating optic fiber core 130. The process ENDS with step 2016.

Figure 8:
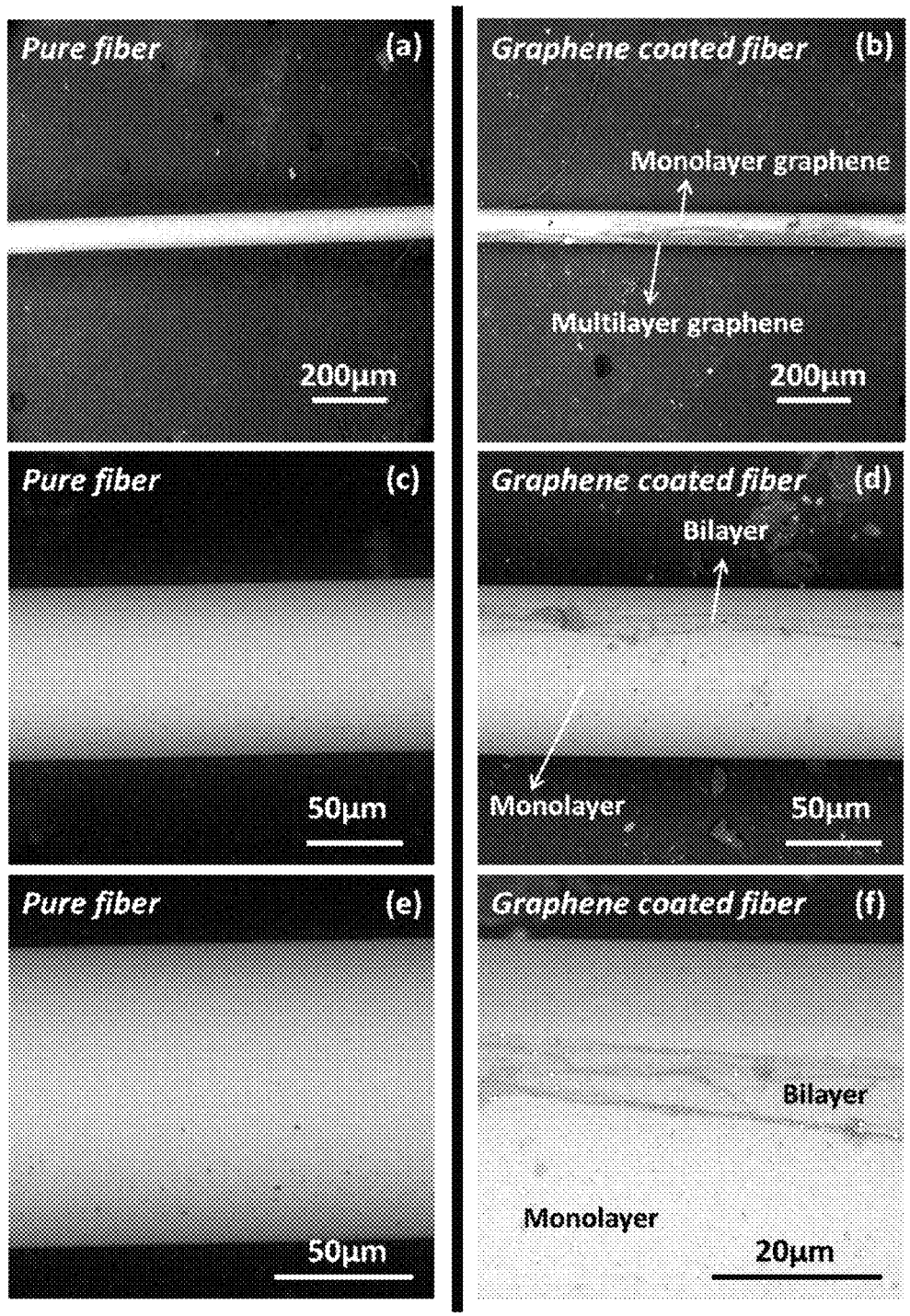
FIG. 8 illustrates Scanning Electron Microscope (SEM) images of a pure optic fiber that is not coated with graphene adjacent to an optic fiber that is coated with graphene at three different resolutions.

FIG. 8 illustrates Scanning Electron Microscope (SEM) images of a pure optic fiber that is not coated with graphene adjacent to an optic fiber that is coated with graphene at three different resolutions. FIG. 8(*a*) illustrates an SEM image of a pure silica optic fiber that is not coated with graphene at a magnification of 150×. FIG. 8(*b*) illustrates an SEM image of a optic fiber coated with a graphene cylinder at a magnification of 150×. The graphene cylinder is a monolayer of graphene in portions and multilayer graphene in other portions. The graphene coated areas are a bit darker than the pure silica fiber, particularly in the areas where the graphene is multilayer. FIG. 8(*c*) illustrates an SEM image of a pure silica optic fiber that is not coated with graphene at a magnification of 800×. FIG. 8(*d*) illustrates an SEM image of a optic fiber coated with a graphene cylinder at a magnification of 800×. In FIG. 8(*d*), it can be seen that the graphene conforms highly to the contours of the optic fiber. The darker areas of graphene indicate that monolayer graphene may be overlapped to form bi-layer or multilayer graphene. FIG. 8(*e*) illustrates an SEM zoomed-in image of a pure silica optic fiber that is not coated with graphene at a magnification of 800×. FIG. 8(*f*) illustrates an SEM image of an optic fiber coated with a graphene cylinder at a magnification of 1200×. At this resolution, it can be seen in FIG. 8(*f*) that the surface of the silica fiber is very clean and smooth and covered with a highly conforming layer of graphene. In FIG. 8(*f*), graphene layer is in portions a monolayer and in portions a bi-layer, as evidenced by the darker wrinkled areas of graphene.

Figure 9:
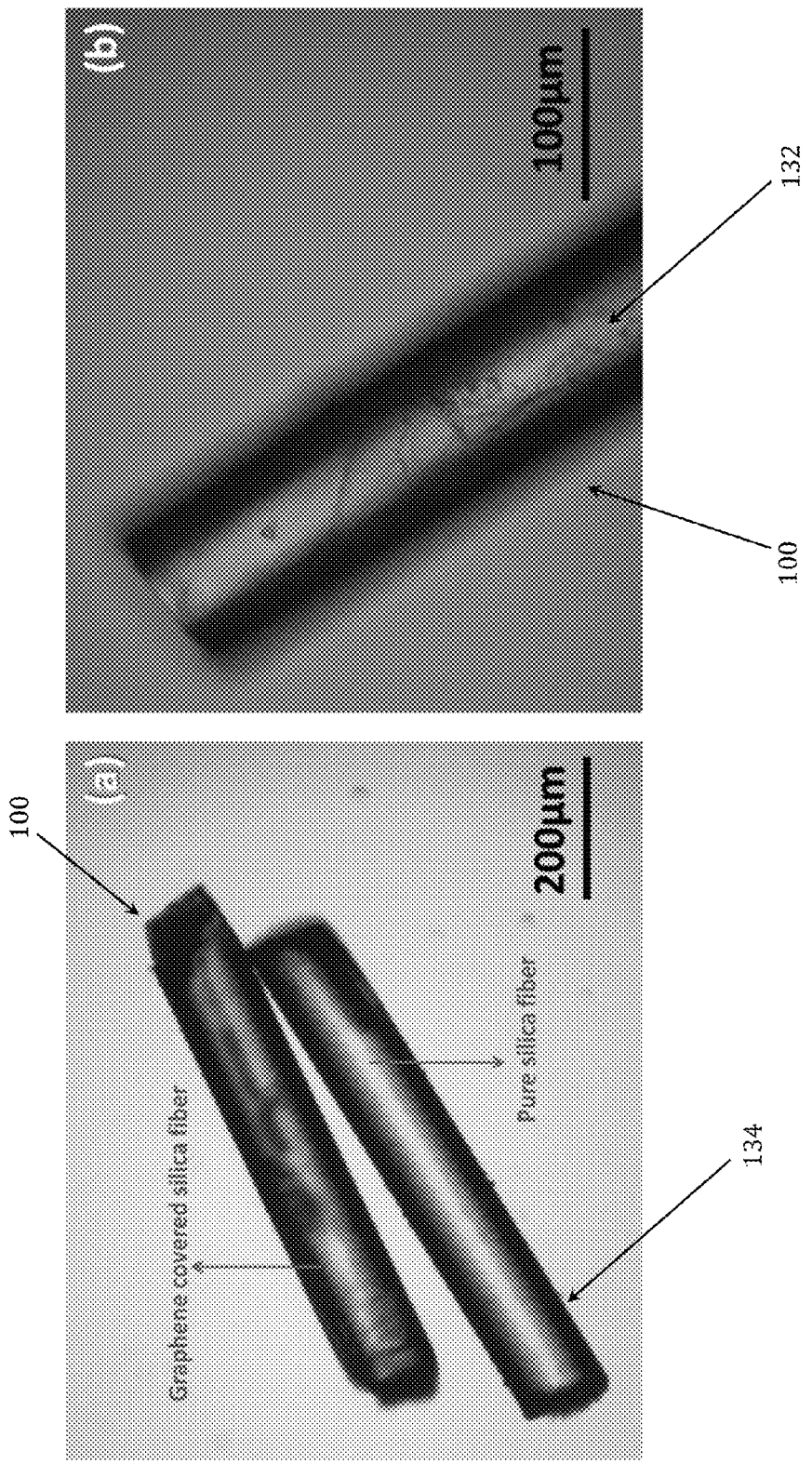
FIG. 9 illustrates an (a) Optical Microscope (OPM) image of a graphene covered silica fiber adjacent to a pure silica fiber not coated with graphene along with a (b) higher resolution OPM image of a graphene coated silica fiber.

FIG. 9 illustrates an (a) Optical Microscope (OPM) image of a graphene covered silica fiber 100 adjacent to a pure silica fiber 134 not coated with graphene along with a (b) higher resolution OPM image of a graphene coated silica fiber 100. In FIG. 9(a), the silica optic fiber 100 is encapsulated by a graphene capsule 132. It is observed that the graphene encapsulated optic fiber 100 is darker in color than the pure silica fiber 134 below it that is not covered with graphene. In addition, the pure silica fiber 134 that is not covered with graphene has a smoother appearing surface than the graphene encapsulated fiber that shows the various layers of the graphene coating 132. In FIG. 9(b), graphene encapsulated optic fiber 100 is viewed at a higher optical resolution revealing the graphene capsule 132 deposited on the fiber. The various shading or coloring differences on the surface of fiber 100 show the graphene deposition in either a monolayer, bi-layer, or multilayer of graphene. FIG. 9(b) illustrates that the graphene conforms to the contours of optic fiber 100 and uniformly covers it.

Figure 10:
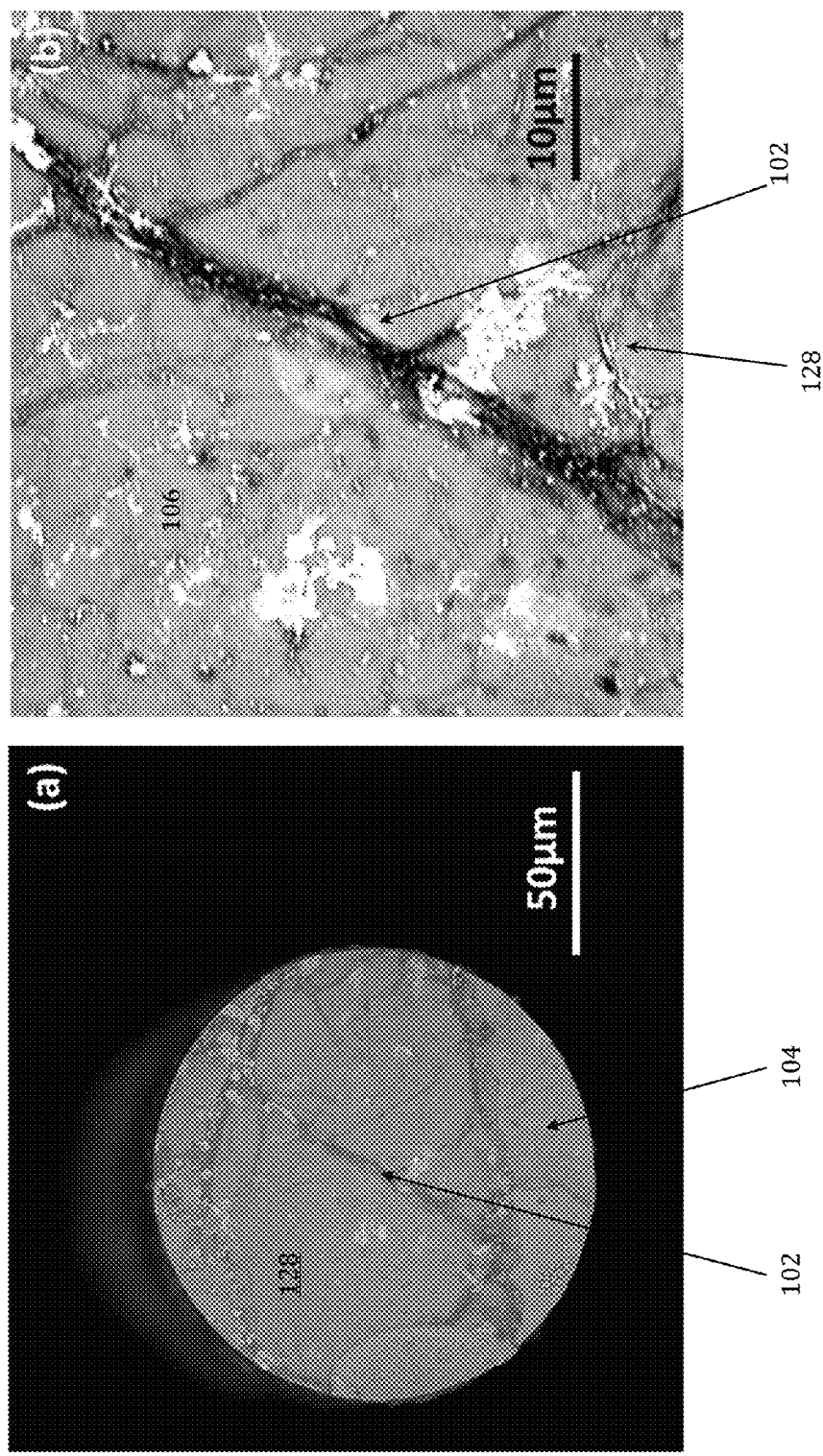
FIG. 10 illustrates SEM images of an end of optic fiber core completely coated with graphene.

FIG. 10 illustrates SEM images of an end of an optic fiber 100 completely coated with graphene. Optic fiber inner core 102 is visible in FIG. 10(a) and FIG. 10 (b) as a white dot at the center of the image. Surrounding optic fiber inner core 102 is silica outer core 104. The mottled transparent surface covering the end of optic fiber inner core 102 and silica outer core 104 is graphene coating 128 that forms cladding. End graphene surfaces 128 form a protective barrier for the ends of core 102/104 from mechanical damage such as scratches or abrasion. The various differences of color of graphene coating 128 reveals that portions of graphene coating 128 are formed of a monolayer of graphene, a bi-layer of graphene, or a multilayer of graphene. The darker portions of graphene layer 128, appearing as veins, have the most number of overlapping graphene layers.

Figure 11:
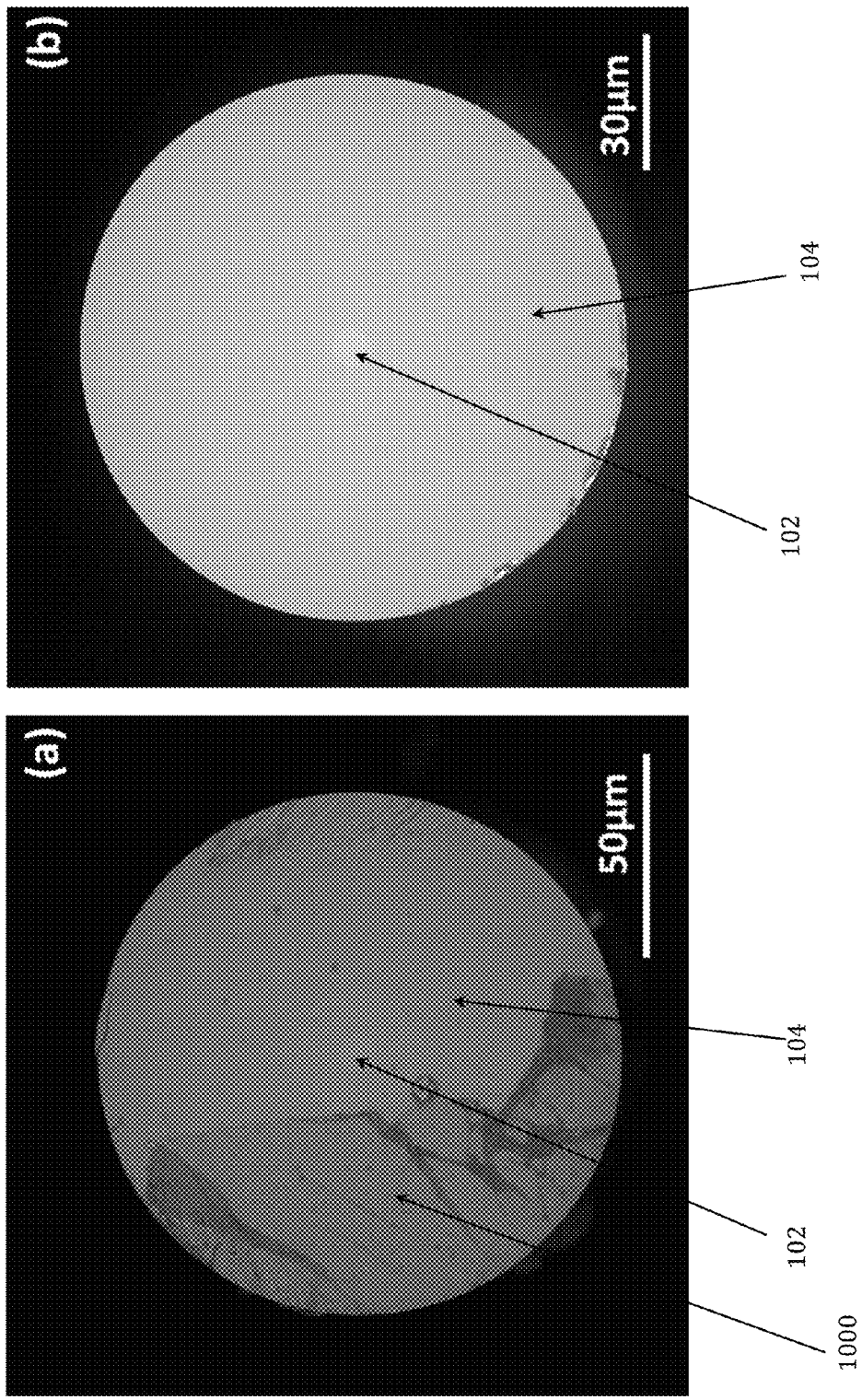
FIG. 11 illustrates SEM images of an end of an optic fiber core partially coated with graphene adjacent to an end of an optic fiber core that is not coated with any graphene.

FIG. 11 illustrates SEM images of an end of an optic fiber inner core 102 and outer core 104 partially coated with graphene 1000 adjacent to an end of an optic fiber inner core 102 and outer core 104 that is not coated with any graphene. FIG. 11 is provided to compare and contrast the end of an optic fiber core 102/104 that is partially covered with graphene 1000 in FIG. 11(a) and not covered at all with graphene in FIG. 11(b) to the optic fiber core 102/104 end of FIGS. 10(a) and (b) that is completely covered with graphene sheet 128. In FIG. 11(b), the end of optic fiber core 102/104 is bright and uniform in color and texture. In FIG. 11(a), a portion of the end of outer core 104 is covered with graphene layer 1000 that shows variances in color/texture due to the fact that some of layer 1000 is a monolayer, a bi-layer, or multilayer of graphene. The darker the color of graphene layer 1000 indicates more layers of graphene compared to lighter areas in color.

Figure 12:
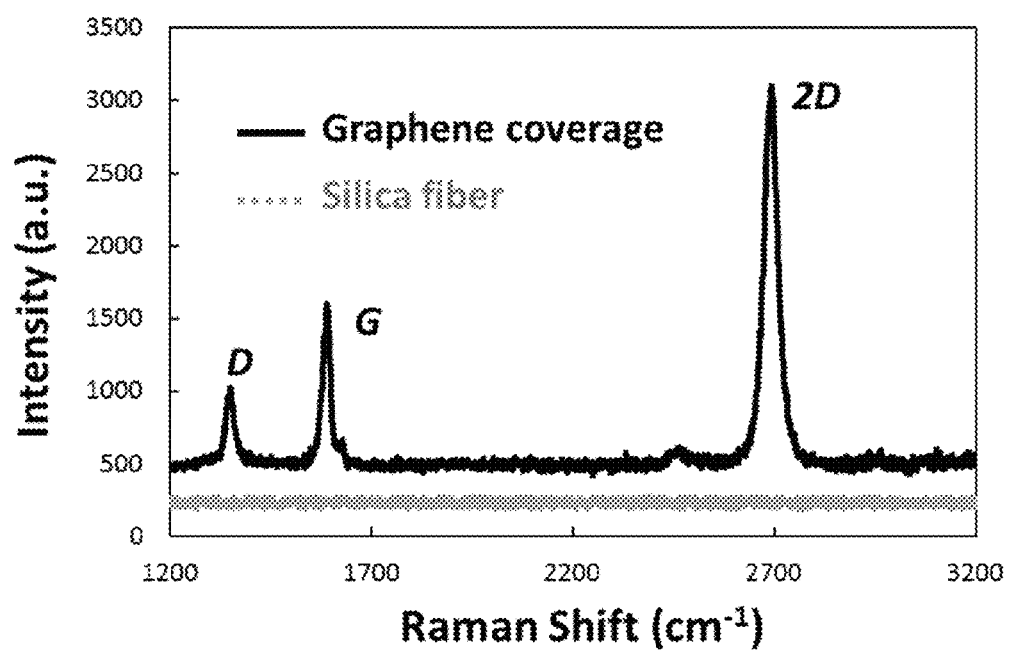
FIG. 12 illustrates a Raman spectra of a graphene coated optic fiber and an optic fiber not coated with graphene for comparison.

FIG. 12 illustrates a Raman spectra of a graphene coated optic fiber and an optic fiber 134 not coated with graphene for comparison. The black solid curve presents the Raman spectra of graphene coating 132 of fiber 100. The narrow D, G and 2D peaks at 1350 cm$^{-1}$, 1580 cm$^{-1}$ and 2690 cm$^{-1}$ show the graphene coating 132 on fiber 100 is of high quality. To compare and contrast, the grey dashed curve presents the Raman spectra of a silica fiber 134 without a graphene coating 132. Note that there area no peaks in the window of 1200 cm$^{-1}$ to 3200 cm$^{-1}$ for the fiber not coated with graphene.

Figure 13:
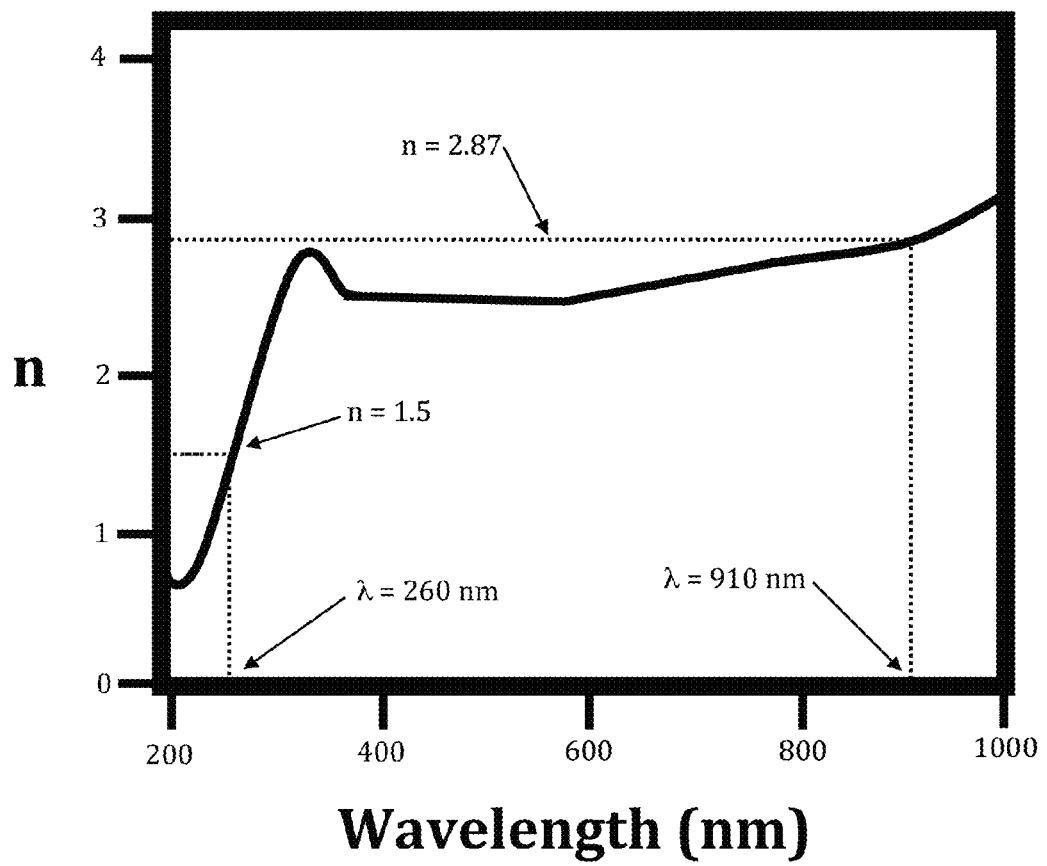
FIG. 13 illustrates the wavelength dependence of the index of refraction n for graphene.

FIG. 13 illustrates the wavelength dependence of the index of refraction n for graphene. The index of refraction of graphene n is dependent upon the wavelength of light. Light having a wavelength from 200 nm to 400 nm is in the ultraviolet spectrum. Light having a wavelength in the range of 400 nm to 600 nm is in the violet-yellow spectrum. Light having a wavelength in the range of 600 nm to 800 nm is in the orange to red spectrum. Light having a wavelength in the range of 800 nm to 1000 nm is in the infrared spectrum. The wavelength dependence of the index of refraction n for graphene is reported in the following reference hereby incorporated by reference: Alex Gray, Mehdi Balooch, Stephane Allegret, Stefan De Gendt, and Wei-E Wang. *Optical detection and characterization of graphene by broadband spectrophotometry*. Journal of Applied Physics 104, 053109 (2008). As shown in FIG. 11, graphene has an index of refraction n<1 at 200 nm. Graphene exhibits an index of refraction n<1.5 below a wavelength of 260 nm. Silica is a common material for optic fiber cores 102 and 104. Silica has an index of refraction of n=1.5. Thus, when optic fiber core 130 is made of silica and propagates light having a wavelength of less than 260 nm, graphene layer 106 can function as cladding because graphene layer 106 has a lower index of refraction than that of silica. An exemplary UV optic circuit utilizing a deep UV LED to emit deep UV light having a wavelength of 245 nm through an optic fiber core 130 encapsulated in a graphene cladding layer 106 is shown in FIG. 6. At 245 nm, optic fiber core 130 may be made of silica and encapsulated by a graphene layer 106 for cladding. Deep UV LEDs having a wavelength of 210 nm are also known and may be used in combination with optic fiber core 130, allowing for smaller diameter sizes for optic fiber core 130 and graphene cladding 106.

Referring again to FIG. 13, graphene generally exhibits an index of refraction below 3 up to 900 nm. While optic fiber core 130 is generally made of silica ($SiO_2$), other types of glasses may be used for optic fiber core 130. In particular, a variety of high index of refraction glasses may be used for optic fiber core 130. Through utilizing a glass with a higher index of refraction, it is possible to utilize a graphene layer 106 as a cladding layer at higher wavelengths of light. For example, halide-chalcogenide glasses have properties that make them suitable for optical fibers and they are reported to have indices of refraction n ranging from 2.54 to 2.87 as reported in the following reference hereby incorporated by reference: Jan Wasylak, Maria Lacka, Jan Kucharski. *Glass of high refractive index for optics and optical fiber*. Opt. Eng. 36(6) 1648-1651 (June 1997) Society of Photo-Optical Instrumentation Engineers. As illustrated in FIG. 13, when optic fiber core 130 is made of a Halide-chalcogenide glass with an index of refraction of 2.87, graphene can be used as a cladding layer 106 for light of wavelengths of less than 910 nm, which is in the infrared portion of the spectrum. Thus, for the deep UV, visible, and a portion of the infrared spectrum Halide-chalcogenide glass may be used for optic fiber core 130 and propagate light from 200 nm to 900 nm with a graphene cladding layer 106. The use of silica and halide-chalcogenide glasses are merely exemplary. It is contemplated that any glass may be utilized for optical fiber core 130 in connection with a graphene cladding capsule 132 with the limitation that the propagation of light wavelengths is limited to the range such that the index of refraction of the graphene is less than the index of refraction of the particular glass used for optic fiber core 130. Examples of other high index refraction glasses include PbO glass that has an index of refraction of n=2. Lanthanum dense flint glass has a refractive index of n=1.8. Flint glass has a refractive index of 1.62. To utilize graphene as a cladding layer, it may be desirable to utilize a monolayer of graphene. Alternatively, it may be desirable to grow multilayer graphene to form a cladding layer. Tellurite glasses of the system $TeO_2$—$WO_3$—PbO, have unique optical and magneto-optical properties, resulting from big mass and polarizability of $Pb^{2+}$ ions. Tellurite glasses are characterized by a high refractive index of about 2.0 and can form optic fibers compatible with a graphene cladding layer.

While the invention has been shown and described with reference to a particular embodiment thereof, it will be understood to those skilled in the art, that various changes in form and details may be made therein without departing from the spirit and scope of the invention.

I claim:

1. A graphene coated optic-fiber laser, comprising:
a doped core; and
a graphene cylinder consisting of a contiguous lattice of covalently-bonded carbon atoms, wherein all of said contiguous lattice of covalently-bonded carbon atoms being directly formed on an outer cylindrical surface of said doped core, thereby containing said doped core inside said graphene cylinder.

2. The graphene coated optic-fiber laser of claim 1, wherein said contiguous lattice of covalently-bonded carbon atoms form a monolayer of graphene.

3. The graphene coated optic-fiber laser of claim 1, wherein said contiguous lattice of covalently-bonded carbon atoms form bi-layer graphene.

4. The graphene coated optic-fiber laser of claim 1, wherein said contiguous lattice of covalently-bonded carbon atoms form multilayer graphene.

5. The graphene coated optic-fiber laser of claim 1, wherein said graphene cylinder is deposited onto said doped core through a Chemical Vapor Deposition (CVD) process.

6. A graphene coated optic-fiber laser, comprising:
a doped inner core surrounded by an undoped outer core; and
a graphene cylinder consisting of a contiguous lattice of covalently-bonded carbon atoms, wherein said contiguous lattice of covalently-bonded carbon atoms being directly formed on an outer cylindrical surface of said undoped outer core, thereby containing said doped inner core and said undoped outer core inside said graphene cylinder, wherein said doped inner core is doped with a rare earth element.

7. The graphene coated optic-fiber laser of claim 6, wherein said doped inner core is doped with an element selected from a group consisting of erbium, ytterbium, neodymium, dysprosium, praseodymium, and thulium.

8. A graphene coated optic-fiber laser, comprising:
a doped core; and
a graphene capsule fully encapsulating said doped core on all sides.

9. The graphene coated optic-fiber laser of claim 8, wherein said graphene capsule consists of a contiguous lattice of covalently-bonded carbon atoms.

10. The graphene coated optic-fiber laser of claim 9, wherein said graphene capsule is formed in direct contact with said doped core.

11. The graphene coated optic-fiber laser of claim 8, wherein said graphene capsule is formed of a graphene cylinder and a pair of graphene end surfaces placed at each end of said graphene cylinder.

12. The graphene coated optic-fiber laser of claim 8, wherein said graphene capsule is deposited onto said doped core through a Chemical Vapor Deposition (CVD) process.

13. The graphene coated optic-fiber laser of claim 8, wherein said doped core comprises a doped inner core surrounded by an undoped outer core, wherein said doped inner core is doped with a rare earth element, wherein said undoped outer core is in direct contact with said graphene capsule.

14. The graphene coated optic-fiber laser of claim 8, wherein said doped core is doped with an element selected from a group consisting of erbium, ytterbium, neodymium, dysprosium, praseodymium, and thulium.

15. The graphene coated optic-fiber laser of claim 1, wherein said doped core is doped with an element selected from a group consisting of erbium, ytterbium, neodymium, dysprosium, praseodymium, and thulium.

16. The graphene coated optic-fiber laser of claim 7, wherein said contiguous lattice of covalently-bonded carbon atoms form a monolayer of graphene.

17. The graphene coated optic-fiber laser of claim 7, wherein said contiguous lattice of covalently-bonded carbon atoms form bi-layer graphene.

18. The graphene coated optic-fiber laser of claim 7, wherein said contiguous lattice of covalently-bonded carbon atoms form multilayer graphene.

19. The graphene coated optic-fiber laser of claim 7, wherein said graphene cylinder is deposited onto said doped core through a Chemical Vapor Deposition (CVD) process.

* * * * *